United States Patent [19]
Singer

[11] Patent Number: 6,111,753
[45] Date of Patent: Aug. 29, 2000

[54] VOLTAGE REGULATOR MODULE

[75] Inventor: James Singer, Houston, Tex.

[73] Assignee: Compaq Computer Corp., Houston, Tex.

[21] Appl. No.: 09/100,699

[22] Filed: Jun. 19, 1998

[51] Int. Cl.[7] .................................................. H05K 7/20
[52] U.S. Cl. ............................................ 361/719; 361/785
[58] Field of Search .............................. 165/104.33, 80.3; 363/16, 50, 65, 141; 323/273, 902; 361/687, 694, 695, 697, 699, 700, 717–719, 784, 785, 788, 796, 803; 62/259.2

[56] References Cited

U.S. PATENT DOCUMENTS

| | | |
|---|---|---|
| 5,019,717 | 5/1991 | McCurry . |
| 5,648,892 | 7/1997 | Wieloch . |
| 5,844,777 | 12/1998 | Gates . |
| 5,880,945 | 3/1999 | Borkar . |
| 5,901,038 | 5/1999 | Cheng . |

*Primary Examiner*—Gerald Tolin
*Attorney, Agent, or Firm*—Williams, Morgan & Amerson

[57] ABSTRACT

A digital system that includes a main printed circuit board that has a first conductive portion formed thereon is provided. A microprocessor module is coupled to and extends orthogonally from the first conductive portion of the main circuit board. A voltage regulator printed circuit board is coupled to and extends orthogonally from the first conductive portion of the main circuit board adjacent the microprocessor module. The voltage regulator printed circuit board supplies a regulated voltage to the microprocessor module over the first conductive portion.

9 Claims, 4 Drawing Sheets

VOLTAGE REGULATOR MODULE

BACKGROUND OF THE INVENTION

1. Field of the Invention

This invention relates generally to digital systems, and, more particularly, to voltage regulation of components within a digital system.

2. Description of the Related Art

In the field of electronics, designers have been continuously reducing the size of components, such as transistors on a semiconductor chip, to increase the speed and performance of the electronic circuits, and to more efficiently utilize semiconductor real estate. For example, only a few years ago, a microprocessor was made up of less than one million transistors; however, recently microprocessors have been constructed with more than eight million transistors. This greatly increased number of components has necessarily increased the amount of heat dissipated by modern microprocessors. To ensure stable operation of a microprocessor, manufacturers commonly require that they be maintained within a preferred temperature range. That is, cooling, such as by forced-air ventilation, is standard in modern computer systems.

A voltage regulator is commonly used with a microprocessor in a conventional computer system to precisely control the voltages provided to the microprocessor and other components within a computer system. Conventional voltage regulators are also responsible for generating substantial heat, which can exacerbate the cooling problems of the modern computer system. Moreover, with reduced component size and reduced voltage rails, the voltage margin is reduced. That is, modern microprocessors require a closely controlled voltage supply. However, the voltage regulator's ability to precisely control voltage levels is also dependent upon temperature. That is, an overheated voltage regulator may not produce an output voltage within the desired operating range of the microprocessor.

Accordingly, to aid in cooling a conventional computer system, the voltage regulator is commonly positioned a considerable distance from the microprocessor. However, separating the voltage regulator from the microprocessor generally reduces the ability of the voltage regulator to closely control output voltage. As the electrical connections that deliver power between the microprocessor and voltage regulator become longer, the ability to tightly regulate the voltage becomes difficult. Additionally, the use of longer lines within a system may hinder the routing efficiency of a computer system because of the limited amount of system real estate available for routing signals. Thus, remote voltage regulation requires that the output voltage be even more precisely controlled to account for variations introduced by the increased distance. More precise control of the output voltage generally equates to increased cost and reduced efficiency.

The present invention is directed to overcoming, or at least reducing the effects of, one or more of the problems set forth above.

SUMMARY OF THE INVENTION

In one aspect of the present invention, a digital system is provided. The digital system includes a main printed circuit board that has a first conductive portion formed thereon. A microprocessor module is coupled to and extends orthogonally from the first conductive portion of the main circuit board. A voltage regulator printed circuit board is coupled to and extends orthogonally from the first conductive portion of the main circuit board adjacent the microprocessor module. The voltage regulator printed circuit board supplies a regulated voltage to the microprocessor module over the first conductive portion.

BRIEF DESCRIPTION OF THE DRAWINGS

The invention may be understood by reference to the following description taken in conjunction with the accompanying drawings, in which like reference numerals identify like elements, and in which.

Figure 1:
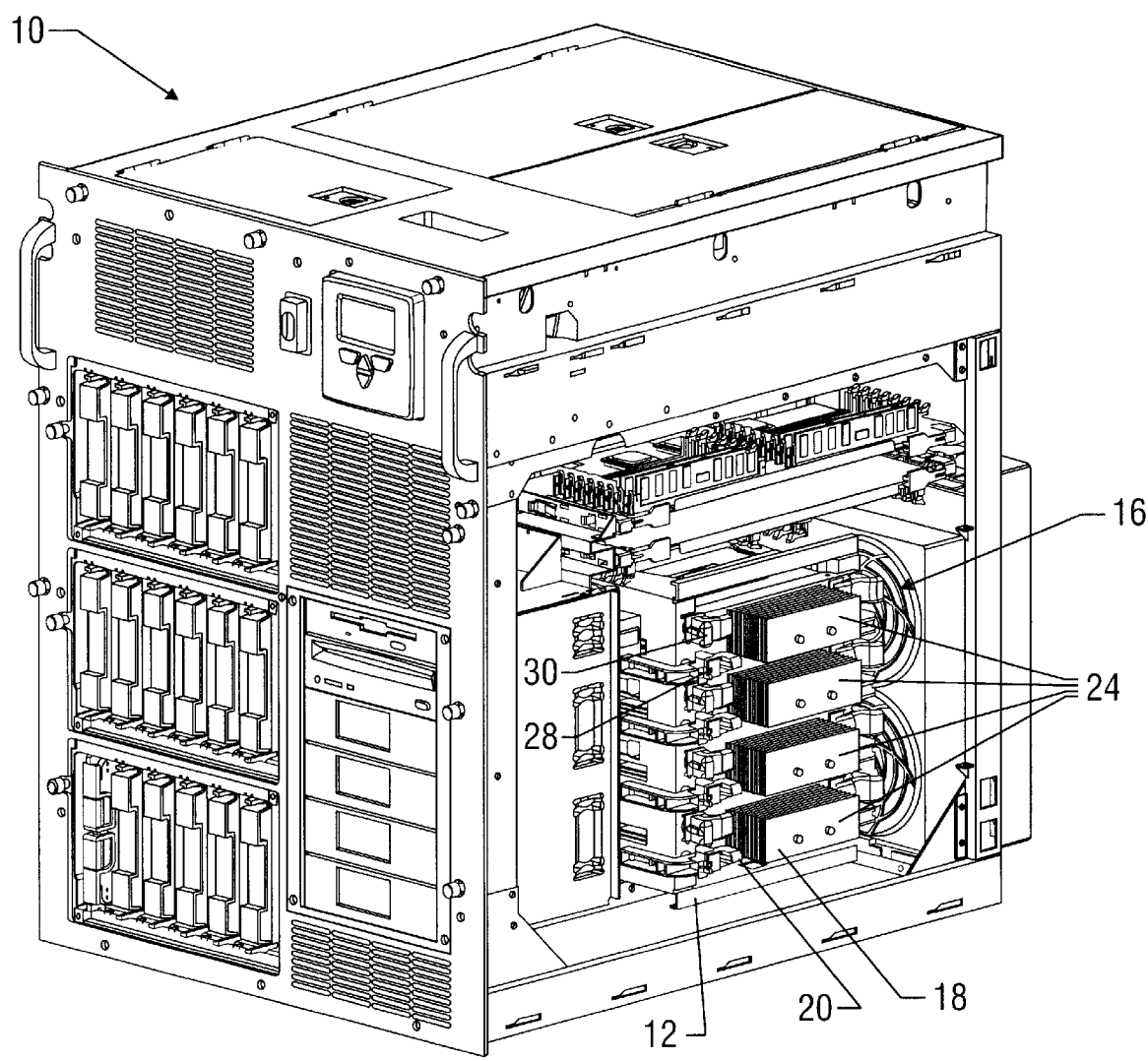
FIG. 1 illustrates a perspective view of a computer system, such as a server.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Overview

Turning now to the drawings, and in particular, to FIG. 1, a perspective view of a personal computer, such as a server 10 is shown. The server 10 has a side access panel (not shown) removed, exposing a microprocessor cage 12 mounted to a motherboard (not shown). The microprocessor cage 12 houses a plurality of printed circuit boards 16. In the embodiment of the server 10 illustrated in FIG. 1, the printed circuit boards 16 are of two general types, a microprocessor module 18 and a voltage regulator module 20. As its name suggests, the microprocessor module 18 contains a microprocessor (not shown), such as an Intel Pentium II Xeon or P2XP®, its associated circuitry (not shown), and a heat sink 24. The voltage regulator module 20 is positioned adjacent the microprocessor module 18, generally providing the function of controlling voltages delivered to the microprocessor board 18. In the embodiment of the server 10 illustrated in FIG. 1, four microprocessor boards 18 and four voltage regulator modules 20 are included within the microprocessor cage 12. The present invention provides an improved voltage regulator by utilizing a unique arrangement in which the voltage regulator modules 20 are placed in close proximity to the microprocessor modules 18.

Specific Embodiments

Figure 2A:
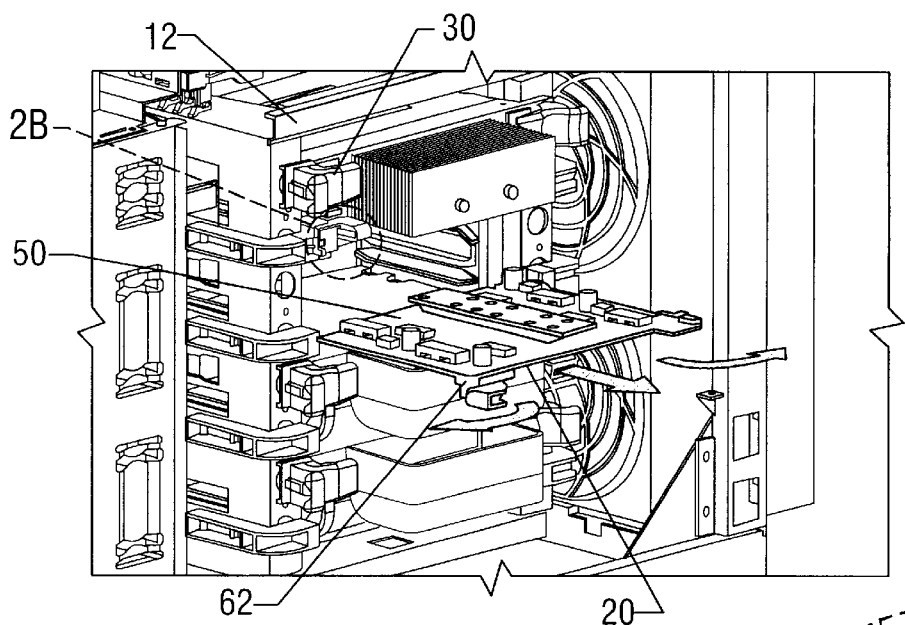
FIG. 2 illustrates an exploded perspective view of a voltage regulator module and a microprocessor cage of the server of FIG. 1.
Figure 2B:
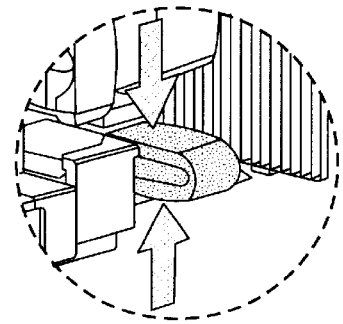
Figure 3:
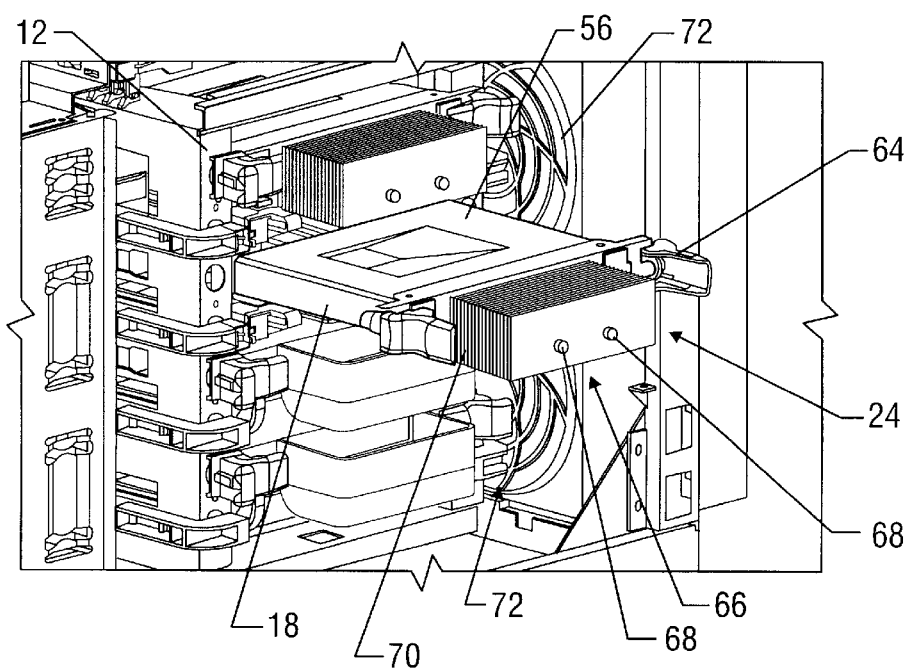
FIG. 3 illustrates an exploded perspective view of a microprocessor module and the microprocessor cage of the server of FIG. 1.

FIGS. 2 and 3 respectively illustrate the voltage regulator module 20 and microprocessor module 18 being removed from the microprocessor cage 12. The voltage regulator module 20 includes a printed circuit board 50 having a conventional edge connector (not shown) engageable with a conventional connector (not shown) mounted on a printed circuit board, such as a motherboard (not shown). Likewise, the microprocessor module 18 also includes a printed circuit board 56 having a conventional edge connector (not shown) engageable with a conventional connector (not shown) mounted on the motherboard (not shown). The printed circuit boards 50, 56 engage the motherboard (not shown) at an angle of about 90 degrees, in parallel with each other and closely proximate to one another. In one embodiment, the printed circuit boards 50, 56 are separated by a distance of about 2 inches.

The voltage regulator module 20 is held in place in the microprocessor cage 12 by a latching mechanism 62. The latching mechanism 62 is described in detail in co-pending application Ser. No. 09/099,592, filed contemporaneously with the current application, now U.S. Pat. No. 5,973,934 and subject to assignment to a common assignee, the content of which in its entirety is hereby incorporated by reference.

Similarly, the microprocessor module 18 is held in place in the microprocessor cage 12 by a latching mechanism 64. The latching mechanism 64 is described in detail in co-pending application Ser. No. 09/099,585, filed contemporaneously with the current application, now U.S. Pat. No. 5,978,233 and subject to assignment to a common assignee, the content of which in its entirety is hereby incorporated by reference.

The heat sink 24 is affixed to the microprocessor module 18 to aid in removing heat from the area of the microprocessor cage 12. The heat sink 24 includes a heat pipe 66 generally formed from a pair of thermally conductive rods 68 having first end portions extending along and coupled to the printed circuit board 56, and second end portions coupled to a plurality of fins 70. The fins 70 substantially increase the surface area of the printed circuit board 18 so that cooling of the board 18 may be dramatically enhanced. Air flow generated by a pair of cooling fans 72 is forced over the fins 70, causing heat to move from the printed circuit board 56, into the rods 68, and out of the fins 70. The heat pipe 24 is described in detail in co-pending application Ser. No. 08/951,932, filed on Oct. 16, 1997, and subject to assignment to a common assignee, now U.S. Pat. No. 5,986,882 the content of which in its entirety is hereby incorporated by reference.

Figure 4:
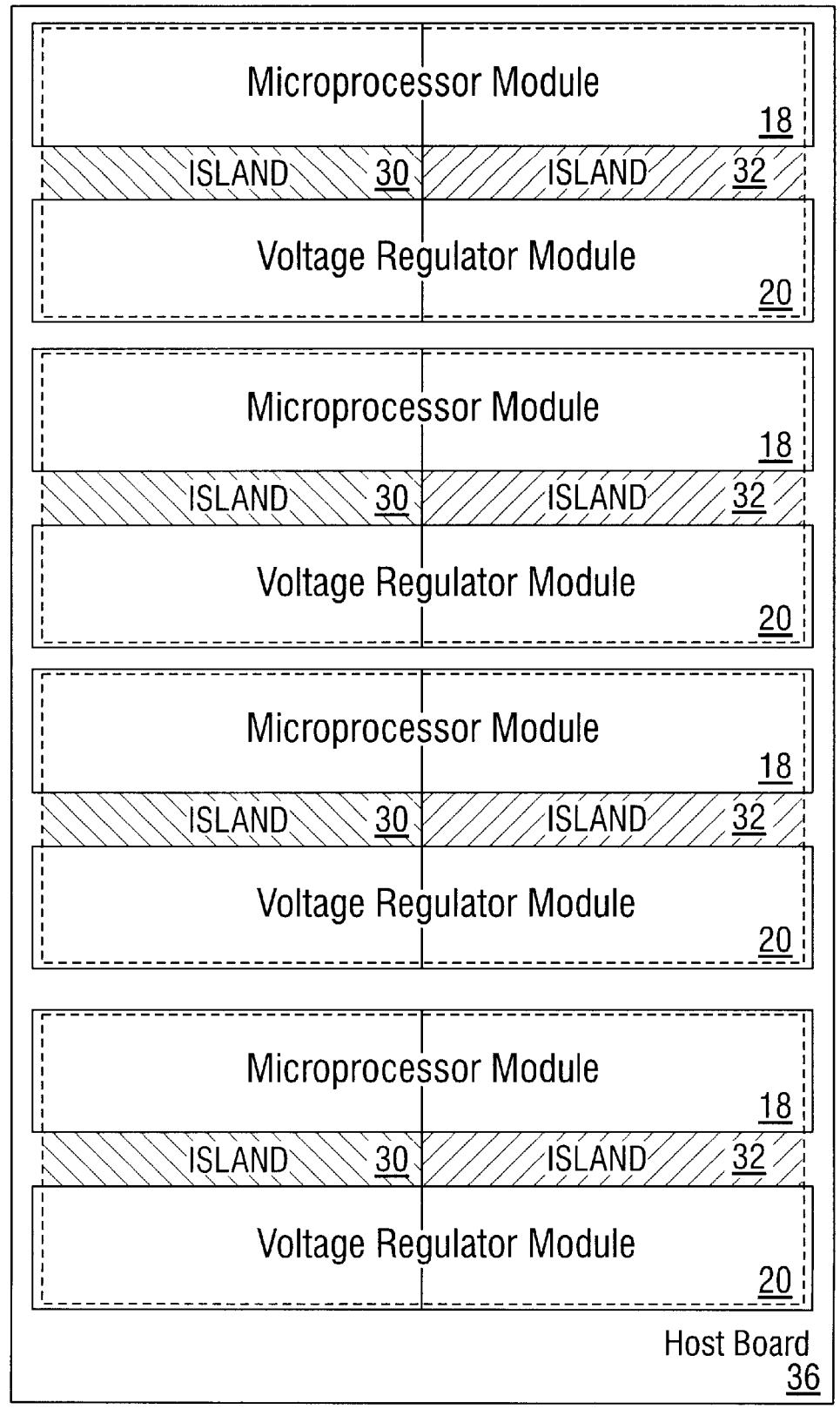
FIG. 4 is a block diagram of a portion of the computer system of FIG. 1, illustrating a voltage regulator module of the present invention.

FIG. 4 is a top view block diagram of the motherboard 36 in the area adjacent the microprocessor cage 12. In the embodiment illustrated in FIG. 4, four microprocessor modules 18 are shown with four voltage regulator modules 20 interspersed therebetween. Each voltage regulator module 20 is associated with and electrically coupled to an adjacent microprocessor module 18.

Typically, a conductive material is used to electrically couple together components on a printed circuit board so that signals and voltages may be transferred therebetween throughout the computer system. One skilled in the art will appreciate that the physical dimensions of a conductive material may be used to classify it. For example, traces or conductive lines generally have the smallest width and correspondingly high impedance. Power planes, though similar to traces, are considerably wider and have very low impedance. Islands are a third type of electrical coupling, with physical dimensions between those of a plane and a trace. Islands generally have higher impedance than planes, but lower than traces because of the constrained dimensions. A printed circuit board may utilize a trace, island, or power plane or any combination thereof to interconnect components. The motherboard 36 of the present invention utilizes islands to electrically couple the microprocessor modules 18 to the voltage regulator modules 20 because of the close proximity therebetween. If the microprocessor modules 18 and the voltage regulator modules 20 were remotely located, using islands to electrically couple the printed circuit boards 18, 20 would be prohibitive because of the amount of printed circuit board real estate used, and the difficulty in maintaining proper regulation.

In the illustrated embodiment, the microprocessor module 18 and voltage regulator module 20 are electrically coupled by a pair of islands 30, 32. In some applications a single island would be sufficient, but the microprocessor module 18 of the present invention includes a microprocessor (not shown) and cache (not shown) that operate at different voltage levels. Thus, the voltage regulator module 20 supplies two separate voltages over the two separate islands 30, 32.

Figure 5:
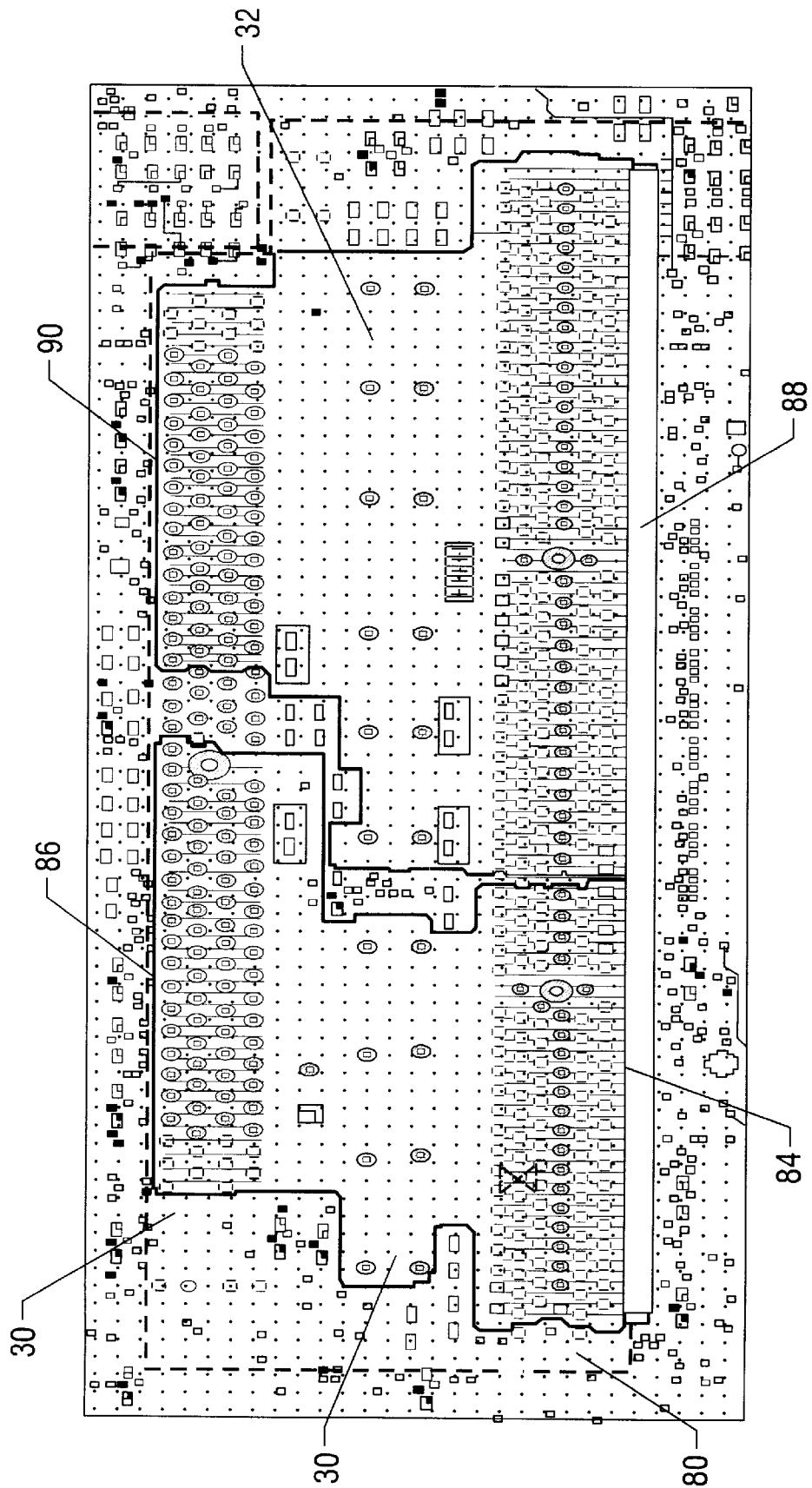
FIG. 5 is a top view of a motherboard of the server of FIG. 1.

FIG. 5 illustrates a top view of the motherboard 36 in the area of the microprocessor cage 12. In particular, FIG. 5 shows the portion of the motherboard 36 that would receive a pair of conventional connectors (not shown) to be coupled to the edge connectors (not shown) of one pair of a microprocessor module 18 and a voltage regulator module 20. In the embodiment illustrated herein, the portion of the motherboard 36 illustrated in FIG. 5 is duplicated four times to accommodate the four pairs of microprocessor modules 18 and voltage regulator modules 20.

A first and second set of plated-through holes 80, 82 are positioned on the motherboard 36 to receive the conventional connectors (not shown) for the microprocessor module 18 and the voltage regulator module 20. A first portion 84 of the plated-through holes 80 are coupled to a first portion 86 of the plated through holes 82 by the island 30. Similarly, a second portion 88 of the plated-through holes 80 are coupled to a second portion 90 of the plated through holes 82 by the island 32. The islands 30, 32 arc comprised of a beryllium copper plating formed on the surface of the motherboard 36. Individual holes within the first and second sets 80, 82 may be selectively coupled to the islands 30, 32

Additionally, a plurality of traces (not shown) extend between selected plated-through holes in the sets 80, 82 so that the voltage level delivered to the microprocessor module 18 may be monitored. These monitor traces are not visible in the embodiment illustrated in FIG. 5 because the motherboard 36 is a multilevel board and the monitor traces are located internal. These monitor traces may be used to provide compensation for reductions of the regulated voltage. If the voltage applied to the islands 30, 32 "falls" below a designated voltage level, the monitor traces may be used to compensate for this reduction. The monitor traces communicate the low voltage level to the voltage regulator module 20, which responds by increasing the voltage applied to the islands 30, 32 until it reaches the desired regulated voltage level. One skilled in the art will appreciate that the number of monitor traces may vary depending upon design constraints.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A digital system, comprising:
    a main printed circuit board having a first island formed thereon;
    a microprocessor module coupled to and extending orthogonally from the first island of said main circuit board;
    a heat sink coupled to said microprocessor module; and
    a voltage regulator printed circuit board coupled to and extending orthogonally from the first island of said main circuit board adjacent said microprocessor module, said voltage regulator printed circuit board supplying a regulated voltage to said microprocessor module over said first island.

2. The digital system of claim 1, wherein the heat sink is a heat pipe.

3. The digital system of claim 1, wherein said microprocessor module is positioned substantially in parallel with said voltage regulator board and spaced approximately two inches therefrom.

4. A computer system, comprising:
    a motherboard having a first island formed thereon;
    a microprocessor module coupled to and extending orthogonally from the first island of said motherboard;
    a first heat sink coupled to said microprocessor module; and
    a voltage regulator printed circuit board coupled to and extending orthogonally from the first island of said motherboard adjacent said microprocessor module, said voltage regulator printed circuit board supplying a regulated voltage to said microprocessor module over said first island.

5. The computer system of claim 4, wherein said motherboard includes a second island formed thereon, said computer system further comprising:
    a second microprocessor module coupled to and extending orthogonally from the second island of said motherboard, said second microprocessor module being located adjacent said first voltage regulator;
    a second heat sink coupled to said microprocessor module; and
    a second voltage regulator printed circuit board coupled to and extending orthogonally from the second island of said motherboard adjacent said second microprocessor module, said second voltage regulator printed circuit board supplying a regulated voltage to said second microprocessor module over said second island.

6. The digital system of claim 4, wherein the heat sink is a heat pipe.

7. The digital system of claim 4, wherein said microprocessor module is positioned substantially in parallel with said voltage regulator board and spaced approximately two inches therefrom.

8. A computer system, comprising:
    a motherboard having a first island and second island formed thereon;
    a first microprocessor module coupled to and extending orthogonally from the first island of said motherboard;
    a first heat sink coupled to said microprocessor module;
    a first voltage regulator printed circuit board coupled to and extending orthogonally from the first island of said motherboard adjacent said microprocessor module, said voltage regulator printed circuit board supplying a regulated voltage to said microprocessor module over said first island;
    a second microprocessor module coupled to and extending orthogonally from the second island of said motherboard, said second microprocessor module being located adjacent said first voltage regulator;
    a second heat sink coupled to said second microprocessor module; and
    a second voltage regulator printed circuit board coupled to and extending orthogonally from the second island of said motherboard adjacent said second microprocessor module, said second voltage regulator printed circuit board supplying a regulated voltage to said second microprocessor module over said second island.

9. A computer system, comprising:
    a motherboard having a plurality of islands formed thereon;
    a plurality of microprocessor modules, each microprocessor module being coupled to and extending orthogonally from at least one of the plurality of islands of said motherboard;
    a heat sink coupled to said microprocessor modules; and
    a plurality of voltage regulator printed circuit boards, each voltage regulator printed circuit board being coupled to and extending orthogonally from at least one of the plurality of islands of said motherboard adjacent at least one of said microprocessor modules, each of said voltage regulator printed circuit boards supplying a regulated voltage to at least one of said microprocessor modules over at least one of said islands.

* * * * *